United States Patent [19]
Lepejian et al.

[11] Patent Number: 6,085,346
[45] Date of Patent: Jul. 4, 2000

[54] METHOD AND APPARATUS FOR BUILT-IN SELF TEST OF INTEGRATED CIRCUITS

[75] Inventors: Yervant David Lepejian, Palo Alto, Calif.; Hrant Marandjian; Hovhannes Ghukasyan, both of Yerevan, Armenia; Lawrence Kraus, San Jose, Calif.

[73] Assignee: Credence Systems Corporation, Fremont, Calif.

[21] Appl. No.: 08/697,969

[22] Filed: Sep. 3, 1996

[51] Int. Cl.[7] .................................................. G01R 31/28
[52] U.S. Cl. ................................... 714/733; 714/724
[58] Field of Search .................... 714/733, 724, 714/718, 719

[56] References Cited

U.S. PATENT DOCUMENTS 5,784,323   7/1998   Adams et al. ........................ 365/201

*Primary Examiner*—Phung M. Chung
*Attorney, Agent, or Firm*—Smith-Hill and Bedell

[57] ABSTRACT

A BIST function is provided in which both the routing area devoted to the test signals and the area devoted to the circuits required to implement the BIST routines are minimized, while also including the ability to test a plurality of embedded memories at full speed in parallel. Testing the memories at full speed both reduces test time and improves the quality of the testing.

18 Claims, 7 Drawing Sheets

METHOD AND APPARATUS FOR BUILT-IN SELF TEST OF INTEGRATED CIRCUITS

BACKGROUND OF THE INVENTION

The present invention relates to semiconductor integrated circuits and, more particularly, to test circuits built into the integrated circuits that enable efficient testing of embedded memory, especially read/write memory.

As integrated circuits achieve higher and higher levels of integration it is common to find several memory blocks of differing sizes embedded within blocks of logic in the integrated circuit. A typical example of embedded memory is the data and instruction cache memories along with their associated tag and valid data cache memories that are embedded in most modern microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic.

Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs.

Testing of memories is generally accomplished by applying test vectors to the memory and reading back the results to ensure proper memory operation. However, testing an embedded memory through the surrounding logic may require a number of test vectors larger than the available memory available in the automatic test equipment used for testing the device and is, in any case, very time-consuming. It is additionally undesirable because the programs to execute such tests require a large amount of skilled test engineering time, which adds to the overhead costs.

Another possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden.

To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used JTAG standards. Special test modes which disable the normal operation of the circuit are invoked to enable BIST.

BIST attempts to provide complete fault coverage while minimizing test time and the area of the die that is occupied by the BIST circuitry. In some applications, it is also desirable that diagnostic information be available for faults that are detected. These requirements are in conflict, so various schemes have been developed which optimize one factor at the expense of the others.

One method for reducing the area on the chip devoted to data buses is to use a serial data-in line and a serial data-out line. Buffers are loaded serially and then used for parallel operation during writing, reading and comparison of the results read from the memory with the stored data. A disadvantage to this approach is that the maximum operational frequency is reduced by the width of the data word (e.g., 32 bits), so that the memory is tested at much less than operational frequency. Thus, faults that appear only at normal speed operation, such as capacitive coupling faults and transition faults, are not detected. Another consequence is that the time needed to test the memory is increased by the time necessary to load the buffers serially. This can increase the test time by a factor approximately equal to the width of the memory words.

Another approach is to add multiplexers to the memory input/output lines such that the data read from the memory can be loaded back into adjacent bits during the subsequent write while the memory is in the test mode. Thus, the data from bit 1 is available for writing into bit 2; the data from bit 2 is available for writing into bit 3; etc. The first bit receives new data and the data output from the last bit is routed back to the finite state machine BIST controller for comparison. In operational mode, the multiplexers connect the memory data lines to the chip data bus. Because data is always available for writing when a read operation is completed, the memory may be tested at operational speeds, which increases the quality and accuracy of the test procedure.

In one possible implementation of the above scheme, the output of the last bit of a word in the first memory is fed into the input of the first bit of a word in the second memory, etc. so as to make all of the memories into effectively one very wide memory for testing purposes. Another implementation involves adding a series of control lines so that each memory can be enabled separately. This allows each memory to be tested sequentially. In the case that the embedded memories are of differing depths, the second method must be used because the first method requires that the memory depths be the same.

There are certain drawbacks to these approaches. For example, although the above implementation offers the advantage of small area utilization, it is nonetheless relatively slow. Furthermore, in the case of a failure, all that is known is the word address of the failure. Information as to which bit failed is not available because the word is structured to operate as a serial shift register with no internal observability. Indeed, in the case that the first proposed method of chaining words in parallel is used, not even the memory that failed can be ascertained. For simple pass or fail testing, it is sufficient to identify that a failure has occurred. However, if redundancy is to be used to repair the failure or if the cause of the failure is to be analyzed, critical information is not available. In fact, if the word were to contain an even number of transition or capacitive coupling faults which cause the bit to read the opposite of the intended data, even the presence of the faults is masked.

An alternate approach is to generate data patterns and address sequences centrally and route them to the embedded memories. This approach is faster than the above serial test approach, especially if several embedded memories are tested in parallel. A drawback to this approach is that routing the extra data and address buses consumes significant amounts of area on the chip as the data path width increases from the historical size of 8 bits to 32 or 64 bits, which are increasingly common. It may not be possible to use the same buses for testing and normal operation because the testing signals should be routed in parallel to the embedded memories while the buses in operation are often separate, e.g., the case of data and instruction caches. This means that testing requires extra buses plus a multiplexer per data and address line.

Therefore, it is seen that a new method and apparatus for BIST is desired that minimizes the cost of testing and maximizes testing coverage and capability.

SUMMARY OF THE INVENTION

The present invention minimizes the cost and maximizes the effectiveness of BIST by minimizing both the routing area devoted to the test signals and the area devoted to the circuits required to implement the BIST routines while still providing the ability to test a plurality of embedded memories at full speed in parallel. Testing the memories at full speed both reduces test time and improves the quality of the testing by providing the ability of detecting transition and capacitively coupled faults. Testing the memories in parallel a word at a time provides a great reduction in test time and cost, compared to the serial techniques discussed above.

The area needed for generating test data patterns is minimized by centrally generating encoded data patterns so that a reduced number of signal lines is needed to route the patterns. The test data patterns are then decoded at each embedded memory array individually. The decoding circuitry is also layout efficient and requires much less area than an individual pattern generator.

A further understanding of the nature and advantages of the inventions herein may be realized by reference to the remaining portions of the specification and the attached drawings.

DESCRIPTION OF THE PREFERRED EMBODIMENT

Figure 1:
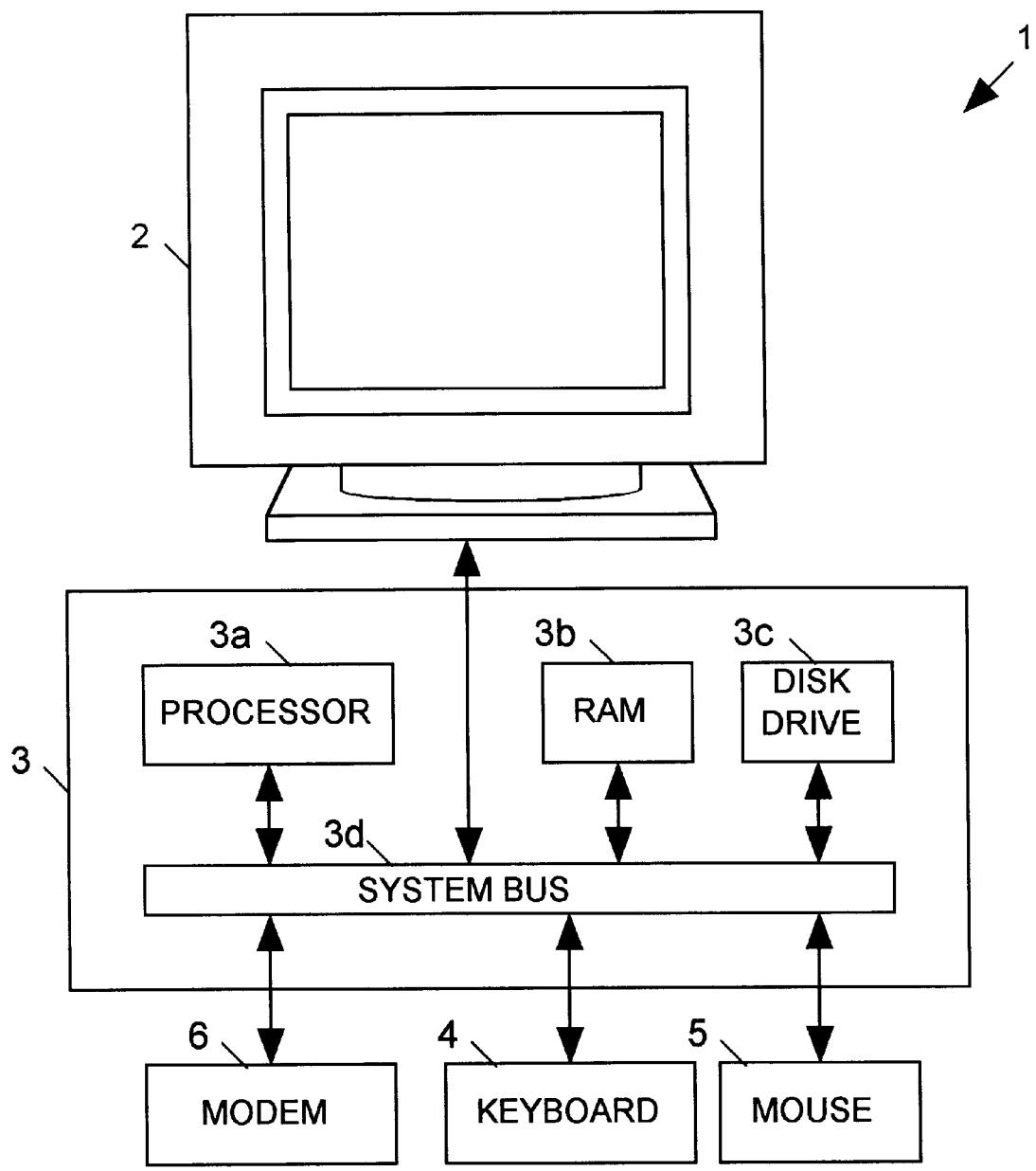
FIG. 1 is a simplified block diagram of a system according to a preferred embodiment of the present invention.

FIG. 1 shows a simplified block diagram of a system 1 according to a preferred embodiment of the present invention. System 1 includes, preferably, a display monitor 2, a computer 3, a keyboard 4, a mouse 5 and a modem 6. In alternate embodiments, the mouse 5 and/or modem 6 may be excluded from the system. Computer 3 includes familiar computer components such as processor 3a, memory storage devices such as a random access memory (RAM) 3b and a disk drive 3c, and a system bus 3d interconnecting the above components. Mouse 5 is only one example of a graphical input device; a trackball is another example. Modem 6 is but one example of a device that enables system 1 to be coupled to a network; a network interface card is another example. RAM 3b and disk drive 3c are examples of computer-readable memory (tangible media) for storage of the herein described computer code and computer programs. Other types of computer-readable media include floppy disks, removable hard disks, optical storage media such as CD-ROMs and bar codes, and semiconductor memories such as flash memory or read-only memory (ROM). It should be clear that FIG. 1 is representative of but one type of a system for embodying the present invention. It will be readily apparent to one of ordinary skill in the art that many system types and hardware and software configurations are suitable for use in conjunction with the present invention.

Figure 2:
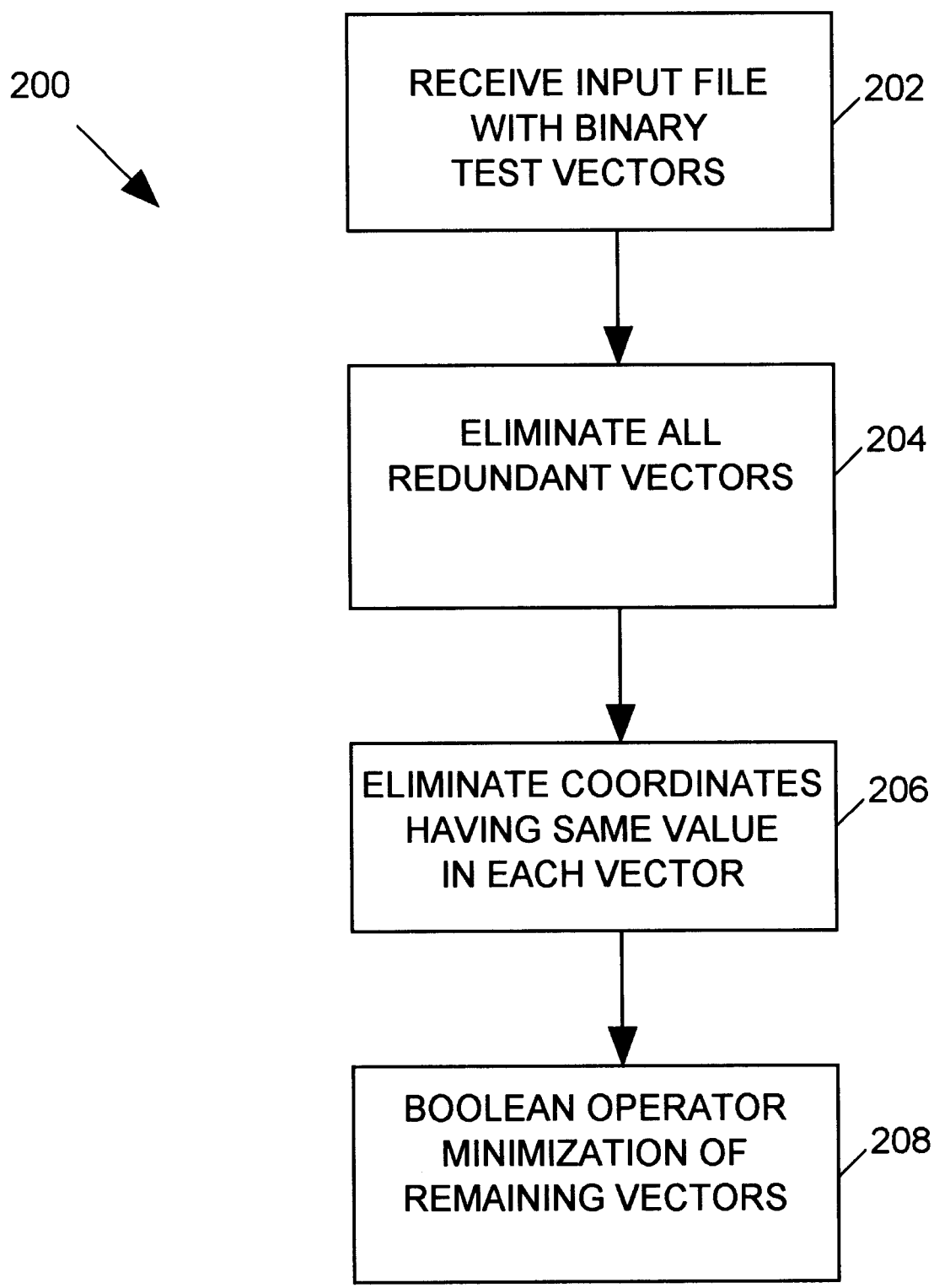
FIG. 2 is a flow diagram showing a preferred method of minimizing the routing and circuit area of a BIST function according to the present invention.

FIG. 2 is a flow diagram 200 showing a method according to the present invention that minimizes the cost and maximizes the effectiveness of BIST by minimizing both the routing area devoted to the test signals and the area devoted to the circuits required to implement the BIST routines, while still providing the ability to test a plurality of embedded memories at full speed in parallel. The area needed for generating test data patterns is minimized by centrally generating encoded data patterns so that a reduced number of signal lines is needed to route the patterns. The test data patterns are then decoded at each embedded memory array individually.

For example, consider an integrated circuit chip having four embedded memory arrays, each 32 bits wide. The test circuitry in the prior art for this chip would require 128 wires, one for each bit of each memory array, between a test controller and the memories. As described above, routing the data and address buses for testing in this IC consumes significant amounts of area on the chip for a data path width of 32 bits, compared to the historical size of 8 bits. However, in the present invention, the number of lines are reduced to a point where the number of test bus lines is less than or equal to $\log_2$(number of patterns) for an encoding and decoding circuit that properly minimizes the width of the encoded data bus. So, if eight patterns are used to exercise the four embedded memories of the integrated circuit chip of the present example, only three (or $\log_2(8)$) wires would be needed to connect the test controller circuitry and the embedded memories, as opposed to 128 wires. The cost of the encoder and decoder is therefore minimized, where the cost of the encoder and decoder is defined to be the required chip layout and routing area. Minimization is accomplished by the manner in which the patterns are assigned to the codes.

In a preferred embodiment, the present invention provides as an output a set of instructions suitable for use as an input to a logic synthesis tool which produces the actual testing circuitry. This is an important point to note since in many applications (e.g., ASIC designs), the circuit design and layout is generated automatically from a higher level system description (e.g., VHDL). It is therefore important that the BIST approach of the present invention be compatible with an automated design process and not require significant manual design and layout.

Accordingly, in flow diagram 200, an input file containing a sequence of binary test vectors is received at step 202. At step 204, all redundant vectors are eliminated. That is, any test vector that appears more than once in the input file can be eliminated for the purposes of encoding the vectors. As an example, assume that a commonly-used "checkerboard" test pattern is being input to test the embedded memories. In the checkerboard pattern, each memory cell is written with a binary value opposite that of its neighbor, so that a cell containing a 1 is surrounded by cells containing 0's, just like a checkerboard. Thus, there may be some repetition of test patterns in the input file, allowing the redundant vectors to be eliminated for encoding purposes. At step 206, coordinates having the same value in each vector can be eliminated, since no additional information is provided, which shortens the length of each vector. At step 208, the input file undergoes Boolean operator minimization through which the minimum number of bits are derived that will uniquely represent each test vector.

As an example, suppose that four test patterns are to be used to test an embedded memory. These patterns are: 1111 . . . 1111 (all 1's), 0000 . . . 0000 (all 0's), 0101 . . . 0101 (alternating 01's), and 1010 . . . 1010 (alternating 10's). Note that the four test patterns can also be uniquely designated by two bits, since two bits can represent four numbers (00, 01, 10 and 11). In general, then, p different test patterns can be uniquely designated by n bits, where $p \leq 2^n$. Therefore, in step 206, using the simple example, the Boolean operator minimizer would represent the four test patterns with two bits. The attachment in Appendix A provides a detailed description of a program that converts a given sequence of binary vectors into an implementation of a minimized Boolean operator.

Figure 3:
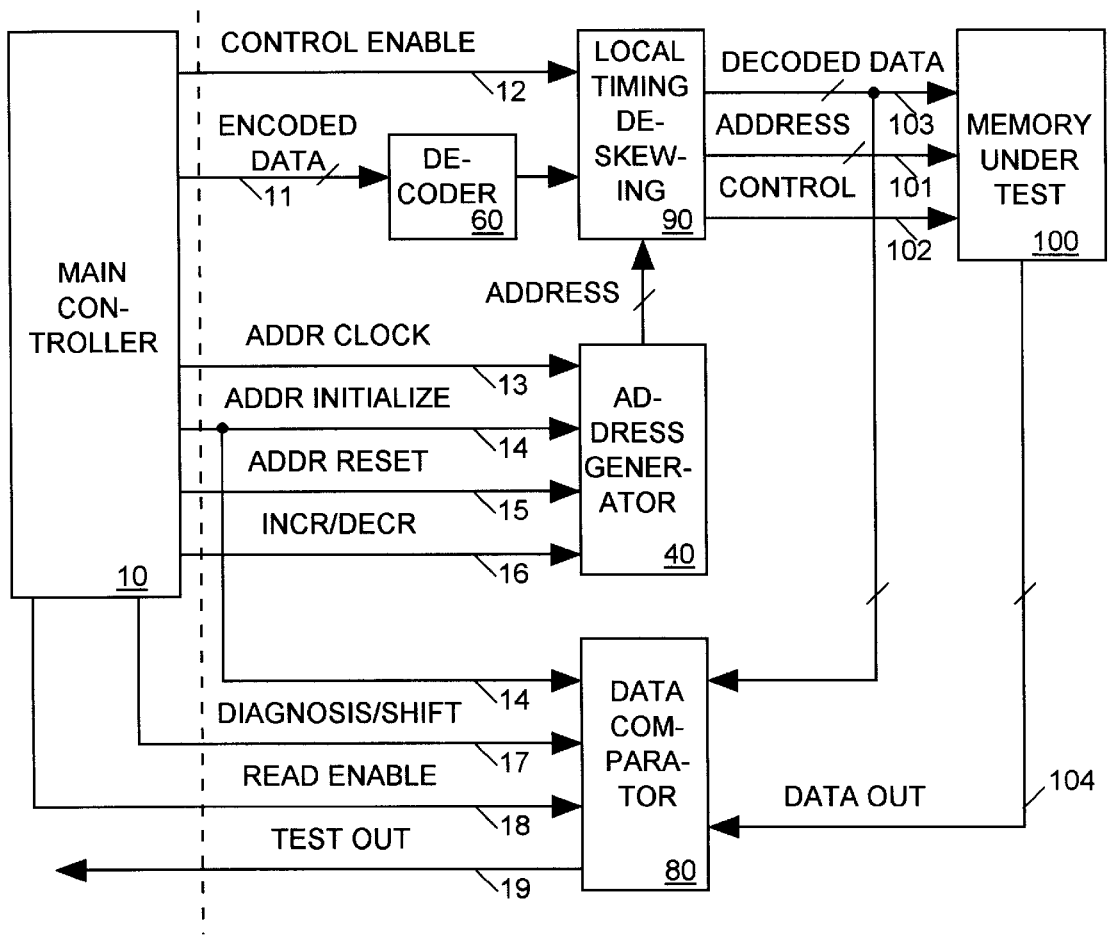
FIG. 3 is a simplified block diagram of the entire BIST circuitry and routing connections of a BIST function according to the present invention.

FIG. 3 shows an overall block diagram of a preferred embodiment of a BIST function according to the present invention. In the figure, those lines that are actually buses (multiple wires) are indicated by having a diagonal line across them. Main controller 10 controls the testing operation. There is one controller 10 in each integrated circuit chip. The remaining set of blocks to the right of the dashed line in the figure are distributed on the order of one full set of blocks per embedded memory array 100 in the chip that is to be tested. The blocks that are distributed for the BIST function are address generator 30, data decoder 60, data comparator 80 and local timing de-skewing circuit 90, each directly coupled to main controller 10. Note that only one of the lines coupling main controller 10 to the distributed blocks is a bus, specifically encoded data bus 12. Again, according to the present invention, the number of lines in encoded data bus 12 is minimized to an amount less than or equal to $\log_2$(number of patterns).

Main controller 10 is responsible for coordinating and synchronizing the tests that are conducted on an embedded memory array 100. Decoder 60 decodes the encoded data on bus 12 from main controller 10 and provides decoded data to de-skewing circuit 90. Address generator 40 receives address clock 13, address initialization signal 14, address reset signal 15, and increment/decrement signal 16 from main controller 10 to generate the addresses used in accessing memory 100. The generated addresses are also provided to de-skewing circuit 90.

Local timing de-skewing circuit 90 provides pulse shaping and edge placement for the input signals to embedded memory array 100. The signals on address bus 101, control line 102 and decoded data bus 103 exercise embedded memory 100 by writing and reading from all of the memory locations in both polarities with differing address sequences.

De-skewing circuit 90 assures that there are no timing problems associated with accessing different embedded memory arrays 100 that may be separated by more than a centimeter on the integrated circuit chip. In an alternate embodiment, where, for example, the embedded memory arrays 100 can be placed in close proximity to one another, de-skewing circuit 90 may not be required, further reducing the chip area used for testing purposes.

Data comparator 80 compares the output data 104 from embedded memory 100 with the corresponding input data 103 and reports the results in a pass/fail format on test output line 19, under the control of diagnosis/shift signal 17 and read clock 18. Should the information be deemed valuable, in an alternate embodiment the addition of two lines would allow the data comparator to report the address location of any failing bits back to main controller 10. This information could then be combined with information regarding pattern and data polarity and be reported to an external tester for further analysis, redundancy repair or other similar actions.

Figure 4:
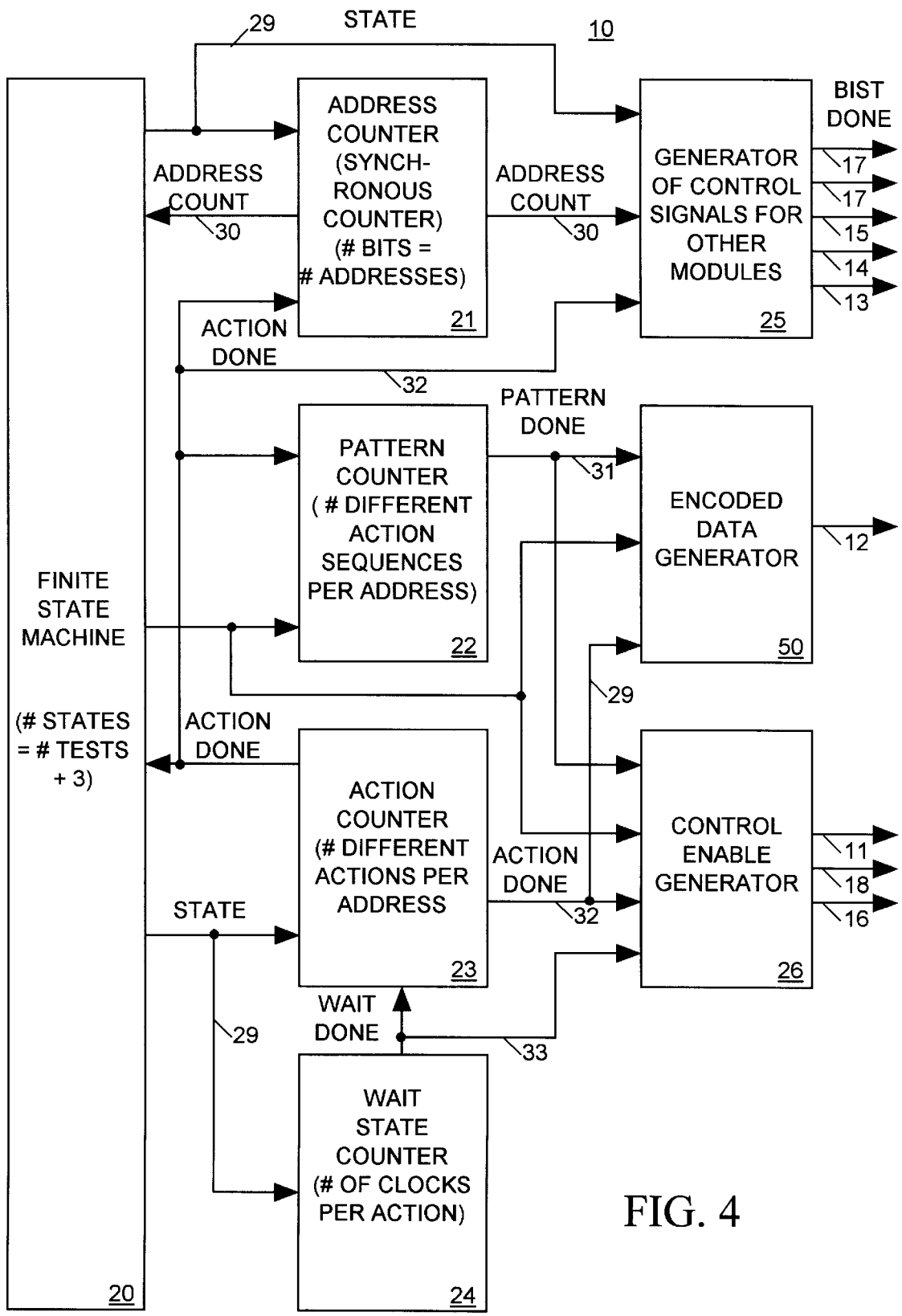
FIG. 4 is a simplified block diagram of the contents of the main controller according to the present invention.

FIG. 4 shows a simplified block diagram of main controller 10. Main controller 10 preferably includes a plurality of counters, since counters can be designed that are both compact (i.e. occupy small layout area) and capable of operation at full operational clock speed. Main finite state machine 20 drives the four separate counters 21, 22, 23, and 24 with state signal 29. Wait state counter 24 counts the number of clocks per action (e.g., read operation, write operation, etc.) and passes the results to action counter 23 and control enable generator 26. Action counter 23 counts the number of different actions per address and passes the results to main finite state machine 20, control enable generator 26, encoded data generator 50, pattern counter 22 and address counter 21.

Address counter 21 receives state signal 29 from state machine 20 and action done signal 32 from action counter 32 to generate address count 30, which is passed to a small block of combinatorial logic 25 that combines this signal with state signal 29 and action done signal 32 to generate BIST done signal 101, diagnosis/shift signal 17, address clock 13, address initialize 14 the address reset 15. These signals are all sent to the distributed BIST circuitry associated with the particular embedded memory array 100 that is to be tested.

Encoded data generator 50 receives pattern done signal 31, state signal 29 and action done signal 32 and generates the encoded data patterns on encoded data bus 12 (FIG. 3). This encoded data is sent to the decoder associated with the particular memory 100 to be tested. Finally, control enable generator 26 combines state signal 29, action done 32, pattern done 31 and wait done 33 to form the control signals control enable 11, increment/decrement 16 and read enable 18. These signals are also sent to the appropriate distributed BIST circuitry.

Using the same example described above, suppose that four test patterns are to be used to test an embedded memory. These patterns are: 1111 . . . 1111 (all 1's), 0000 . . . 0000 (all 0's), 0101 . . . 0101 (alternating 01's), and 1010 . . . 1010 (alternating 10's). These patterns are written into a word in an embedded memory and read back from the memory to test memory operation. In the prior art, if these patterns were written into a 32-bit wide memory, a corresponding 32-bit wide data bus would be needed to write the test data patterns into the embedded memory. This would naturally use a large amount of chip area and routing resources. However, note that the four test patterns can also be uniquely designated by two bits, since two bits can represent four numbers (00, 01, 10 and 11). In general, then, p different test patterns can be uniquely designated by n bits, where $p \leq 2^n$.

Figure 5:
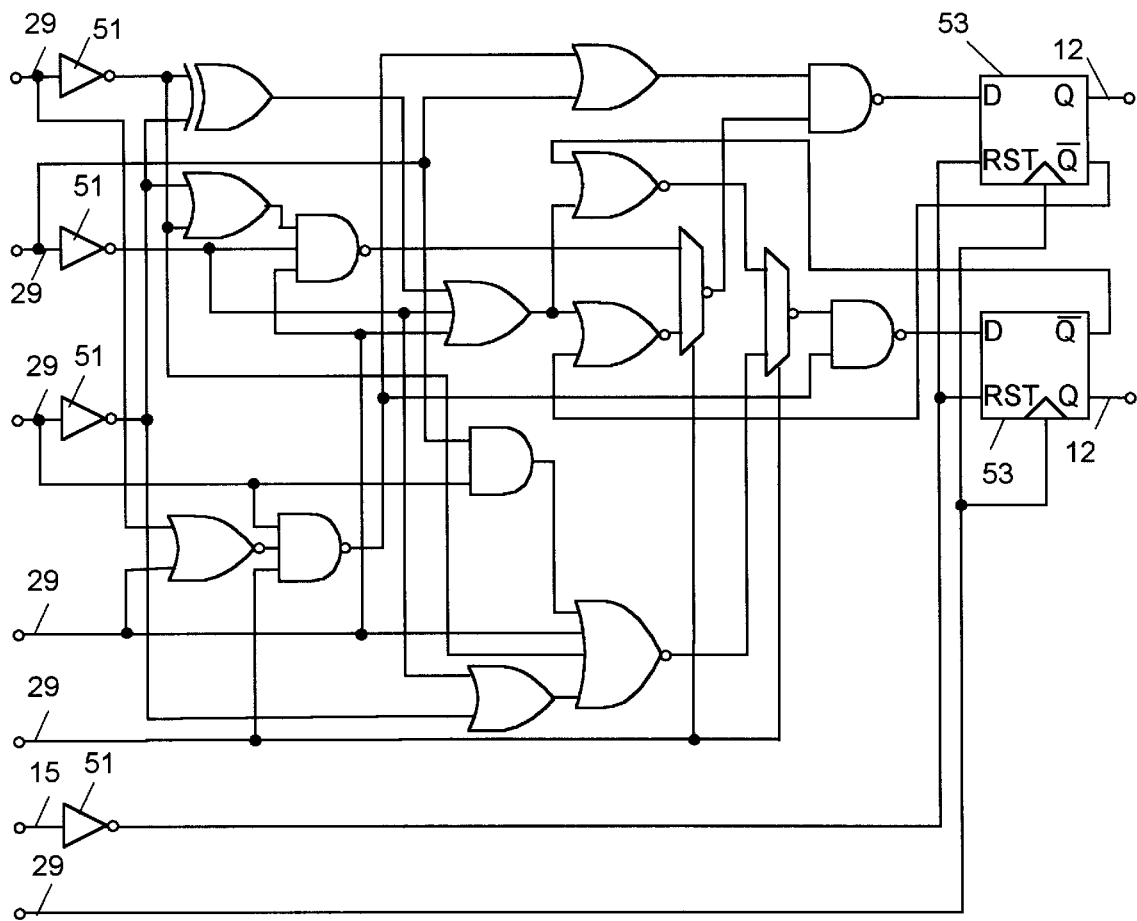
FIG. 5 is a simplified logic diagram of an encoded data generator according to the present invention.

Accordingly, FIG. 5 shows a simplified logic diagram of an encoded data generator 50 generated according to the method described above in FIG. 2 to code the four sample test patterns (all 1's, all 0's, alternating 01's and alternating 10's). Address reset 15 and state signal 29 are input to combinatorial logic 52 (along with their complements) to generate encoded data 12 at the true outputs of the data latches 53.

Figure 6:
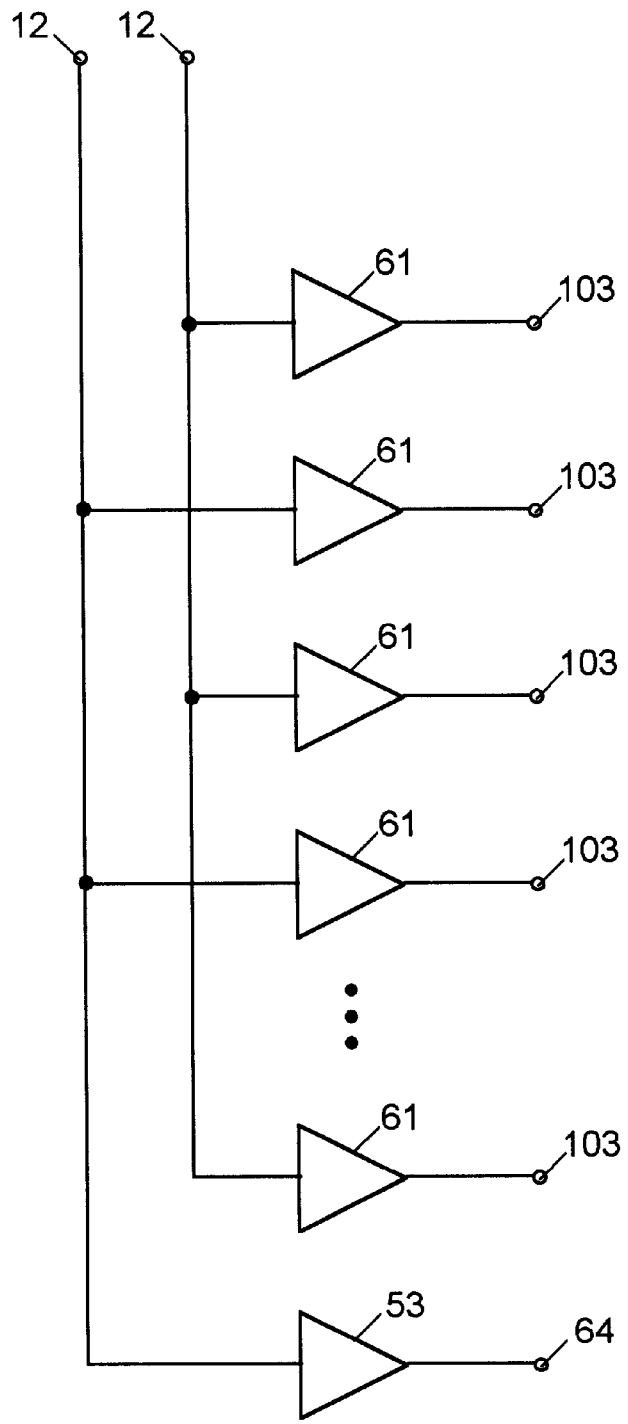
FIG. 6 is a simplified logic diagram of a data decoder according to the present invention.

FIG. 6 shows a decoder 60 generated by the method described above in conjunction with FIG. 2 that corresponds to the particular encoded data generator 50 shown in FIG. 5. It should be noted that in the embodiment shown, only n buffers 61 are needed for the n input lines of encoded data bus 12. No combinatorial logic is required in decoder 60, greatly simplifying the testing circuit. Buffers 61 are generally required for the case in which decoded data signals need to be routed throughout the chip in order to drive the memory data buses adequately. In principle, therefore, data buffers 61 could be eliminated from the testing circuit according to the present invention, but are included for the same reason that they would be needed in the fully decoded data routing case. Thus, for this particular example, there is significant chip area saved because only two signals are routed from the controller to the memories, rather than 32 data buses to each memory (assuming a memory width of 32 bits), for example, due to the intelligent coding of the data signals. It will be evident to one skilled in the art that all cases will not use as simple a decoder as shown in this example. However, the present invention assures that the encoder and decoder that are generated will minimize the cost of testing the embedded memories of the integrated circuit chip.

Figure 7:
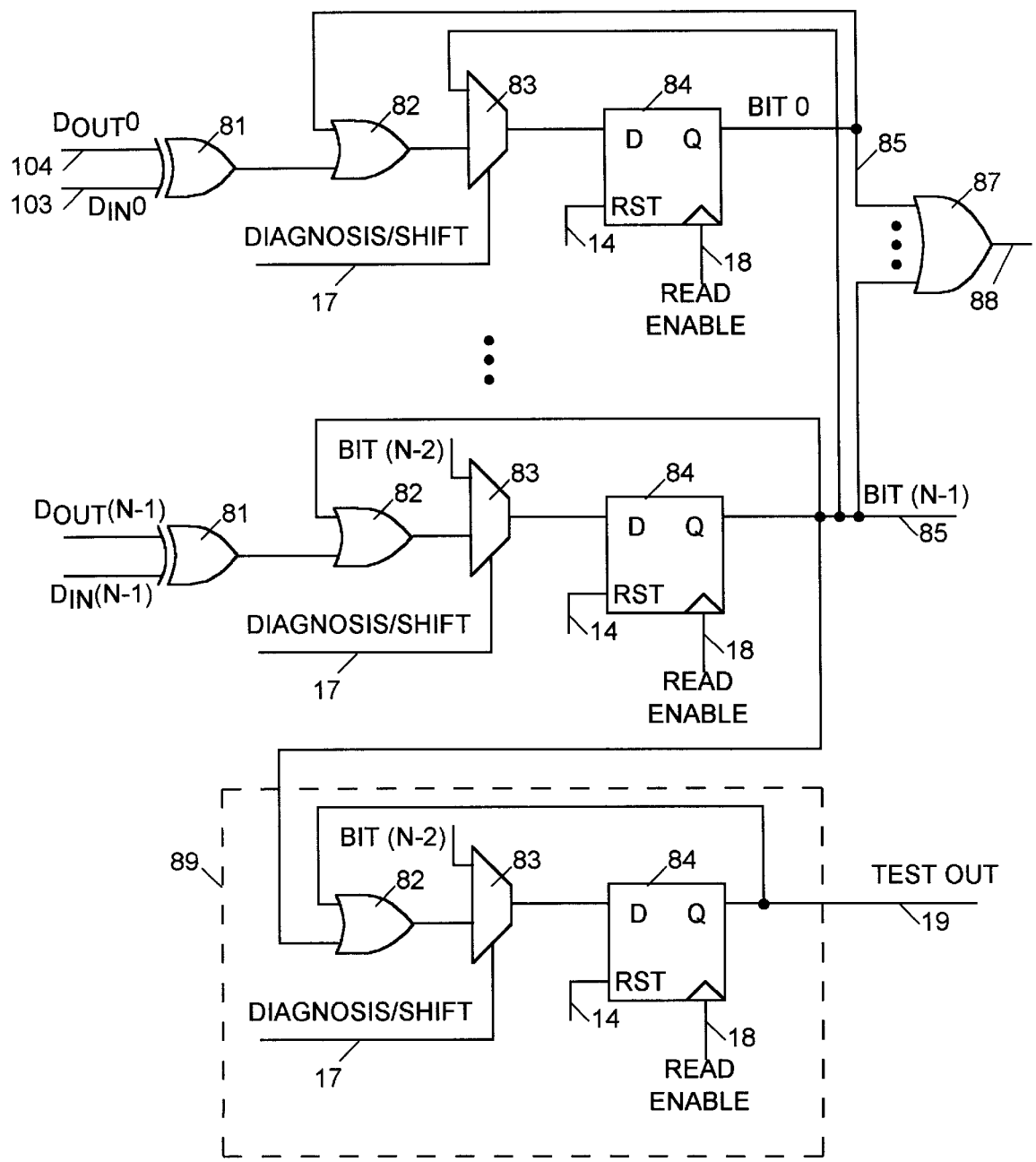
FIG. 7 is a simplified logic diagram of a data comparator according to the present invention.

FIG. 7 shows a simplified logic diagram of a data comparator 80. The n data lines from decoded data bus 103 that are written into embedded memory under test 100 are compared with the n lines on data output bus 104 from memory 100 using n exclusive-OR (XOR) circuits 81. As long as both XOR inputs match, the XOR output is low. indicating that the input data matches the data read back from memory 100. The outputs of XOR circuits 81 are combined with the feedback output of latches 84 as the inputs to OR gates 82. As long as the outputs of an XOR gate 81 and corresponding latch 84 are both low, the output of the corresponding OR gate 82 is also low. During testing, multiplexers 83 pass the outputs of OR gates 82 through to the inputs of latches 84. When the output of embedded memory 100 is valid, read enable signal 18 clocks the input data to the latches through to their outputs.

Thus, as long as the inputs match, low level signals ("0's") circulate through the latches. But if an error is found in memory 100, as evidenced by a mismatch between $D_{in}$ on input bus 103 and $D_{out}$ on output bus 104, XOR 82 will produce a high signal ("1") that will be propagated through to the output of the corresponding latch 84. The "1" in the latch output will cause the corresponding OR gate 82 to produce a "1" on the next cycle, regardless of the result of XOR 82. This high signal will persist throughout the pattern. At the end of each pattern, diagnosis/shift signal 17 causes the output of each latch 84 to be fed into the OR gate 82 of the next highest order bit. Therefore, a high signal output from any latch 84 will propagate through the entire hierarchy of latches. After n cycles, then, a high output from any latch 84 will have caused the test output signal 19 to have gone into a high "1" state, since it is the output of the final stage 89 of the comparator. Test output signal 19 is used to determine if an error was found in embedded memory under test 100.

If the address location of the error is also required, n input OR gate 87 allows the address to be determined. When an error is detected, again, a high signal will be output from one of the latches 84. Since the outputs of latches 84 are the inputs to OR gate 87, the output 88 of the OR gate will be high as well. Output signal 88 can be fed back to main controller 10 and be used as a flag to identify the address at which the error occurs. At the time the error flag 88 is asserted, the state of line 85 is the result of the comparison of the highest order memory bit. Additionally, error flag 88 can trigger main controller 10 to set diagnosis/shift signal 17 in the shift mode such that the next (n-1) address cycles will shift the latched results of the comparison of the failing address onto the line 85 in serial fashion in decreasing order of bit significance. In an alternate embodiment, if error flag 88 is used in the above fashion, then final stage 89 of the comparator can be omitted to save the chip area used for BIST.

The data patterns and logic diagrams used in the example given are in no way limiting and are provided by way of illustration. Many other data patterns may be used, as is well known to those skilled in the art, and will result in different logic diagrams. Moreover, the same logic function can be realized in a number of ways. Accordingly, various modifications may be made without departing from the spirit or scope of the general inventive concept as defined by the appended claims and their equivalents.

What is claimed is:

1. In an integrated circuit chip, a built-in self test (BIST) circuit for testing an embedded memory with a complete set of test data patterns comprising:

a main control circuit for controlling testing of the embedded memory;

a data encoder coupled to said main control circuit for encoding the complete set of test data patterns into a minimized set of test data patterns;

a data decoder coupled to said data encoder for decoding said minimized set of test data patterns into the complete set of test data patterns to be written to the embedded memory, and means controlled by said main control circuit for testing said embedded memory by writing said complete set of test data patterns produced by said data decoder into said embedded memory, reading a set of output data patterns out of said embedded memory, and determining whether said set of output data patterns is similar to said complete set of test data patterns.

2. The built-in self test circuit of claim 1 wherein said means controlled by said main control circuit comprises:

an address generator circuit that generates addresses for writing said complete set of test data patterns to said embedded memory and for reading said set of output data patterns from the embedded memory; and a data comparator circuit that compares said complete set of test data patterns with said set of output data patterns read from the embedded memory.

3. The built-in self test circuit of claim 2 wherein said data comparator further comprises:

a plurality of exclusive-OR gates, each receiving said test input data and said test output data;

a plurality of OR gates, each coupled to a corresponding one of said plurality of exclusive-OR gates; and a plurality of latches, each coupled to a corresponding one of said plurality of OR gates, wherein an output signal from a final one of said plurality of latches indicates whether said test output data matches said test input data.

4. The built-in self test circuit of claim 1 wherein said data encoder further comprises circuitry for encoding the complete set of test data patterns into a minimum number of test data patterns less than or equal to $\log_2(p)$, where p represents the number of test data patterns in the complete set of test data patterns.

5. The built-in self test circuit of claim 4 wherein said data decoder further comprises circuitry for decoding said minimum number of test data patterns less than or equal to $\log_2(p)$, where p represents the number of test data patterns in the complete set of test data patterns, back into the complete set of test data patterns to be written to the embedded memory.

6. The built-in self test circuit of claim 1 wherein said main control circuit further comprises:
   a state machine for initiating a test sequence;
   an address counter coupled to said state machine;
   a pattern counter coupling said state machine to said data encoder;
   a control enable generator coupled to said pattern counter;
   an action counter coupling said state machine to said control enable generator; and
   a wait state counter coupled to said action counter and said control enable generator.

7. A method of performing built-in self test of an embedded memory on an integrated circuit chip by minimizing use of chip area, the method comprising the steps of:
   providing a complete set of test data patterns to be written to the embedded memory;
   encoding said complete set of test data patterns into a minimized set of test data patterns in a centralized control circuit; and
   decoding said minimized set of test data patterns back into said complete set of test data patterns at the embedded memory,
   writing said complete set of test data patterns produced by said data decoder into said embedded memory,
   reading a set of output data patterns out of said embedded memory, and
   comparing set of output data patterns to said complete set of test data patterns.

8. The method of claim 7 wherein said encoding step further comprises the step of encoding said complete set of test data patterns into a minimum number of test data patterns less than or equal to $\log_2(p)$, where p represents the number of test data patterns in said complete set of test data patterns.

9. The method of claim 8 wherein said decoding step further comprises the step of decoding said minimum number of test data patterns less than or equal to $\log_2(p)$, where p represents the number of test data patterns in the complete set of test data patterns, back into said complete set of test data patterns to be written to the embedded memory.

10. The method of claim 8 wherein said step of encoding said complete set of test data patterns further comprises the steps of:
    eliminating redundant patterns in said complete set of test data patterns; and
    eliminating coordinates having a same value in each test data pattern in said complete set of test data patterns.

11. An apparatus for testing a memory embedded within an integrated circuit, said memory comprising a plurality of storage locations, each for storing and reading out a data word of bit width p, where p is an integer greater than 1, the apparatus comprising:
    means implemented within said integrated circuit for generating a first data sequence consisting of first data words of bit width less than p; and
    a test circuit implemented within said integrated circuit, said test circuit comprising,
       means for decoding said first data sequence to produce a second data sequence consisting of second data words of bit width p; and
       test means implemented within said integrated circuit for writing said sequence of data words to said plurality of storage locations, reading data out of said plurality of storage locations and comparing said data read out of said plurality of storage locations to said second data sequence.

12. The apparatus in accordance with claim 11 wherein said test means comprises:
    an address generator for generating an address sequence for addressing each of said storage locations of said memory;
    means for delivering said second data sequence as data input to said memory, for delivering said address sequence as address input to said memory, for signaling said memory to store the second data words of said second data sequence in said plurality of storage locations addressed by said address sequence, and for causing said memory to read data out of said plurality of storage locations; and
    means for comparing the data read out of said plurality of storage locations to said second data sequence.

13. The apparatus in accordance with claim 11 wherein said first data words are of bit width between 1 and $\log_2(p)$, inclusive.

14. An apparatus for testing a plurality of memories implemented within an integrated circuit chip, each said memory comprising a plurality of storage locations, each for storing and reading out a data word of bit width p, where p is an integer greater than 1, the apparatus comprising:
    means implemented within said integrated circuit chip for generating a first data sequence consisting of first data words of bit width less than p;
    a plurality of test circuits implemented within said integrated circuit chip, each test circuit corresponding to a separate one of said memories, each test circuit comprising:
       a decoder for decoding said first data sequence to produce a second data sequence consisting of second data words of bit width p; and
       test means for writing said sequence of data words to said plurality of storage locations of the corresponding memory, reading data out of said plurality of storage locations, and comparing said data read out of said plurality of storage locations to said second data sequence.

15. The apparatus in accordance with claim 14 wherein said test means comprises:
    an address generator for generating an address sequence for addressing each of said storage locations of the corresponding memory;
    means for delivering said second data sequence as data input to said memory, for delivering said address sequence as address input to corresponding memory for addressing said plurality of storage locations, for signaling the corresponding memory to store the second data words of said second data sequence in said plurality of storage locations addressed by said address sequence, and for causing the corresponding memory to read data out of said plurality of storage locations; and means for comparing the data read out of said plurality of storage locations to said second data sequence.

16. The apparatus in accordance with claim 14 wherein said first data words are of bit width between 1 and $\log_2(p)$, inclusive.

17. The method in accordance with claim 14 wherein said second data word sequence consists of data words of bit width between 1 and $\log_2(p)$, inclusive.

18. A method for providing an integrated circuit chip having an embedded memory and a built-in self test (BIST) circuit for testing the embedded memory, said memory comprising a plurality of storage locations for storing and reading out data words of bit width p, where p is an integer greater than 1, the method comprising the steps of:

encoding said first sequence of data words of bit width p to produce a second sequence of data words of bit width less than p, processing said first and second sequences of data words to produce specifications for an encoder circuit for generating said second sequence of data words and a decoder circuit for decoding said second sequence of data words to produce said first sequence of data words;

fabricating said integrated circuit including said memory, said encoder circuit and said decoder circuit specified by said specifications, and a memory test circuit, wherein said encoder circuit generates said first sequence of data words, wherein said decoder circuit decodes said first sequence of data words to produce said second sequence of data words, and wherein said test circuit includes means for determining whether said plurality of storage locations of the corresponding memory can correctly store and read out said second sequence of data words generated by said decoder circuit.

* * * * *